(12) United States Patent
Kopf

(10) Patent No.: US 6,671,186 B2
(45) Date of Patent: Dec. 30, 2003

(54) ELECTROMAGNETIC INTERFERENCE SHIELD

(75) Inventor: Dale R Kopf, Middleton, ID (US)

(73) Assignee: Hewlett-Packard Development Company, L.P., Houston, TX (US)

(*) Notice: Subject to any disclaimer, the term of this patent is extended or adjusted under 35 U.S.C. 154(b) by 0 days.

(21) Appl. No.: 09/839,826

(22) Filed: Apr. 20, 2001

(65) Prior Publication Data

US 2002/0154495 A1 Oct. 24, 2002

(51) Int. Cl.[7] ................................................ H05K 9/00
(52) U.S. Cl. ........................ 361/818; 361/816; 361/800; 174/35 R; 174/356 C; 174/35 MS
(58) Field of Search ................................ 361/799, 800, 361/816, 818; 174/35 R, 35 GC, 35 C, 35 MS; 455/184

(56) References Cited

U.S. PATENT DOCUMENTS

| | | | | |
|---|---|---|---|---|
| 4,825,090 A | * | 4/1989 | Grabis | 174/35 MS |
| 4,891,468 A | * | 1/1990 | Andrae | 174/35 MS |
| 4,932,755 A | * | 6/1990 | Holdridge et al. | 174/35 MS |
| 5,028,739 A | * | 7/1991 | Keyser et al. | 174/35 GC |
| 5,201,879 A | * | 4/1993 | Steele | 174/16.1 |
| 5,455,117 A | * | 10/1995 | Nagano et al. | 174/35 C |
| 5,698,818 A | * | 12/1997 | Brench | 174/35 MS |
| 5,928,076 A | * | 7/1999 | Clements et al. | 174/35 R |
| 6,018,125 A | | 1/2000 | Collins et al. | 174/35 R |
| 6,252,161 B1 | * | 6/2001 | Hailey et al. | 174/35 R |
| 6,297,446 B1 | * | 10/2001 | Cherniski et al. | 174/35 GC |
| 6,567,276 B2 | * | 5/2003 | Kopf et al. | 361/818 |

FOREIGN PATENT DOCUMENTS

JP          2000236192          8/2000 ............ H05K/9/00

* cited by examiner

*Primary Examiner*—Randy Gibson
*Assistant Examiner*—Dameon E. Levi

(57) ABSTRACT

An EMI shield that utilizes a waveguide structure in which all or part of the air flow opening has a non-uniform three dimensional shape.

2 Claims, 11 Drawing Sheets

ELECTROMAGNETIC INTERFERENCE SHIELD

FIELD OF THE INVENTION

The invention relates generally to electromagnetic interference (EMI) shielding in electronic systems.

BACKGROUND OF THE INVENTION

The operation of electronic circuitry used in many electronic devices is often accompanied by unwanted stray electromagnetic radiation. Stray electromagnetic radiation or "noise" can interfere with the performance of surrounding devices. Consequently, it is important to shield electronic devices to reduce electronic noise emanating from those devices.

Redundant arrays of inexpensive or independent storage devices (RAID) are being employed by the mass storage industry to provide variable capacity storage. RAID systems use interconnected disk drives to achieve the desired capacity of mass storage. With this approach, a disk drive of one capacity may be manufactured and packaged with the same or different capacity drives to provide the required storage capacity. RAID systems eliminate the need to manufacture disk drives individually designed to meet specific storage requirements. Each disk drive in a RAID system is usually housed in an individual module for handling and installation. The modules slide into and out of a larger enclosure that houses the array of disk drives and provides the sockets, plug-ins and other connections for the electrical interconnection of the drives. Controllers orchestrate the interconnection and control access to selected disk drives for data reading and writing operations.

Each module includes a plastic housing and, in most cases, some type of metal EMI shielding. Metal shielding is often constructed as metal plates, panels, partial enclosures and the like positioned within or about the housing. The metal attenuates stray electronic signals emanating from the module as well as stray signals coming from surrounding modules. The degree of attenuation increases with the amount, placement and composition of metal shielding. A closed metal box, for example, would provide excellent shielding. The housing, however, must also permit sufficient air flow to cool the device during operation. Hence, there must be adequate openings in the housing and the shielding to provide the necessary degree of cooling air flow.

Air flow openings in EMI shields are typically round, square or hexagonal. As the frequencies of the electromagnetic radiation/noise are increased, the size of the openings are decreased as much as possible while increasing the length of the openings to provide waveguides that attenuate as much of the electromagnetic radiation as possible while still allowing sufficient cooling air flow. The shape of these waveguides stays the same across the length of the opening. A conventional waveguide for EMI shielding, designated by reference number 2, is shown in FIGS. 1 and 2. The range of frequencies of electromagnetic radiation that will be received into and attenuated by the waveguide is determined by the shape of the opening.

SUMMARY OF THE INVENTION

In one embodiment, the invention is directed to an EMI shield that utilizes a waveguide having a three dimensionally non-uniform opening. In another embodiment, the invention is directed to an EMI shield that utilizes a waveguide structure in which the entry, and preferably the exit, is substantially larger than the elongated conduit portion of the waveguide that extends between the entry and the exit. In another embodiment of the invention, each waveguide opening is characterized by a weak receiving antenna, and preferably a weak transmitting antenna, and a waveguide operatively connected between the receiving and transmitting antennas.

DETAILED DESCRIPTION OF THE INVENTION

Figure 1:
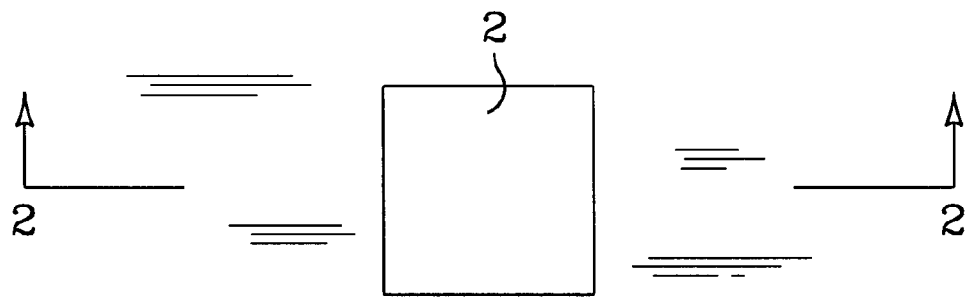
FIGS. 1 and 2 are front and side views, respectively, of a conventional waveguide for EMI shielding.
Figure 2:
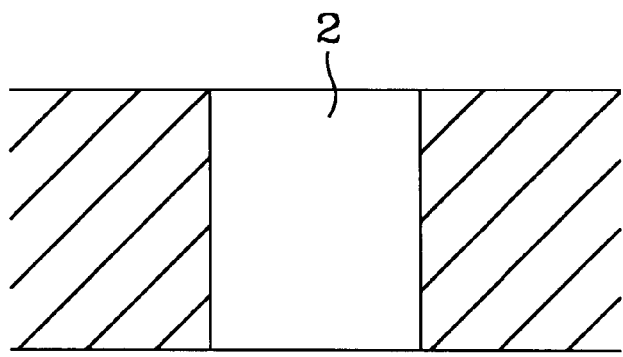
Figure 3:
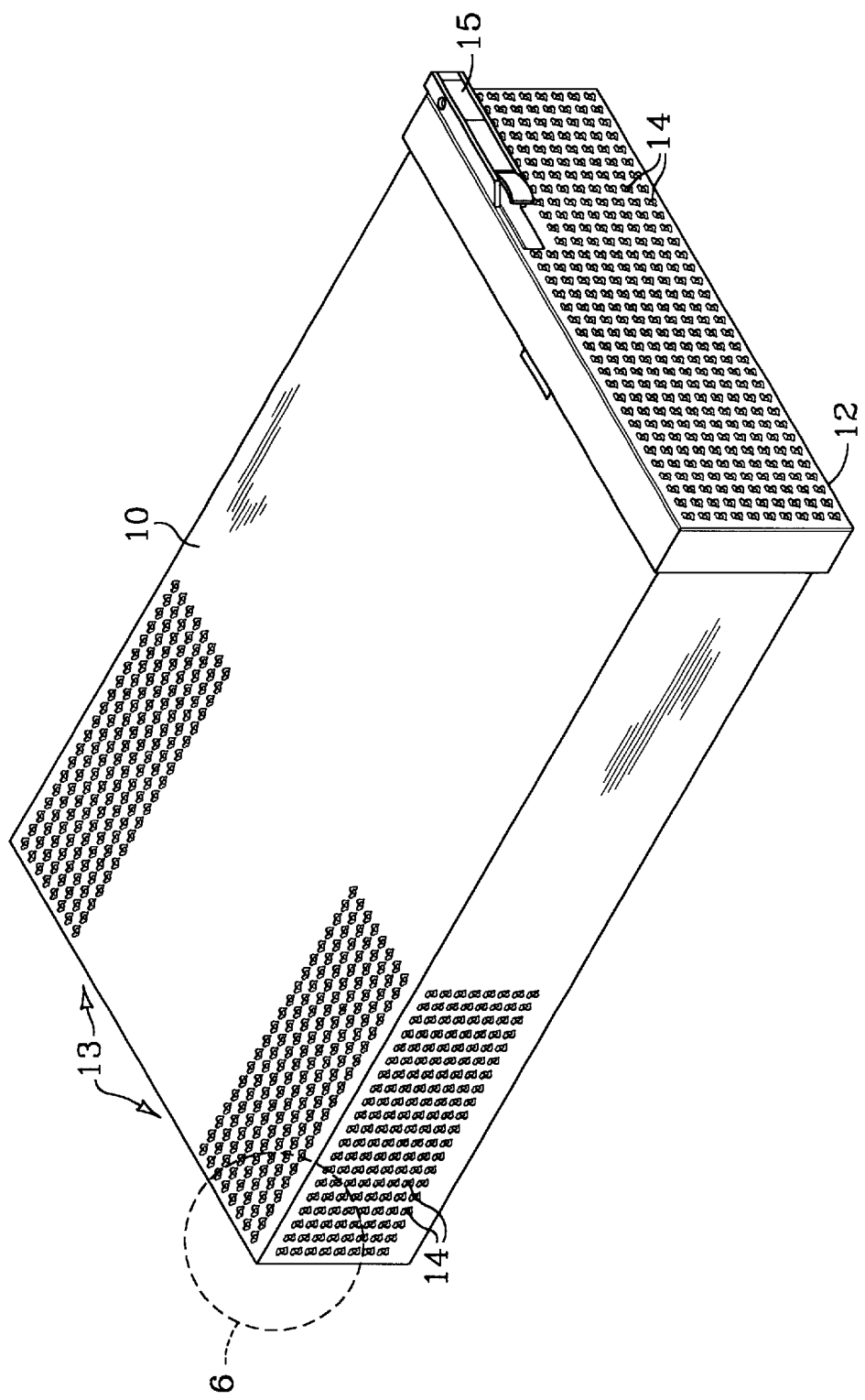
FIG. 3 is a perspective view of an enclosure for a disk drive or other electronic circuitry in which the front and rear portions of the enclosure are constructed as an EMI shield.

FIG. 3 illustrates an enclosure 10 for a disk drive or other electronic circuitry in which the front panel 12 and rear portions 13 are constructed as an EMI shield through which cooling air can flow. A multiplicity of openings 14 are formed along front panel 12 and rear portions 13 of enclosure 10. As described in more detail below, openings 14 function as air flow passages for cooling and as waveguides for EMI shielding. Some type of ejector latch 15 is typically used on front panel 12 to facilitate the installation and removal of enclosure 10 in a group housing unit such as the one described below for FIGS. 4 and 5.

A waveguide is a structure that transmits electromagnetic radiation above a certain "cut-off" frequency. If the electromagnetic radiation is below the cut-off frequency, then the waveguide rapidly attenuates the signals. If the electromagnetic radiation is above the cut-off frequency, then the signals pass readily through the waveguide. Waveguide as that term is used in this Specification and in the Claims refers broadly to any structure forming an opening that will attenuate electromagnetic radiation.

Figure 4:
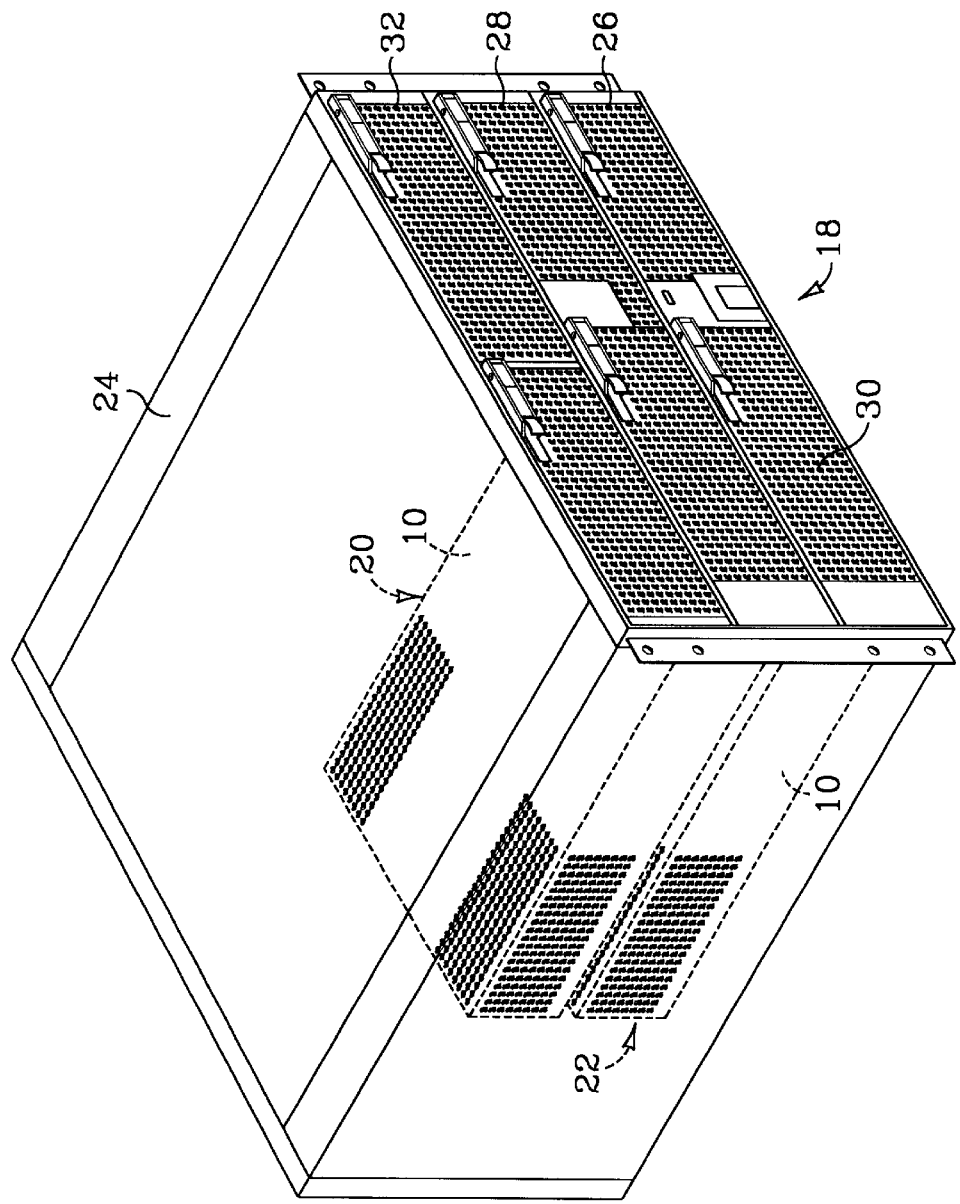
FIG. 4 is a perspective view of the front of a housing for a group of individual device modules, such as the disk drive modules used in RAID data storage systems. The electronic device in one or more of the modules may be housed in an enclosure like the one illustrated in FIG. 3.
Figure 5:
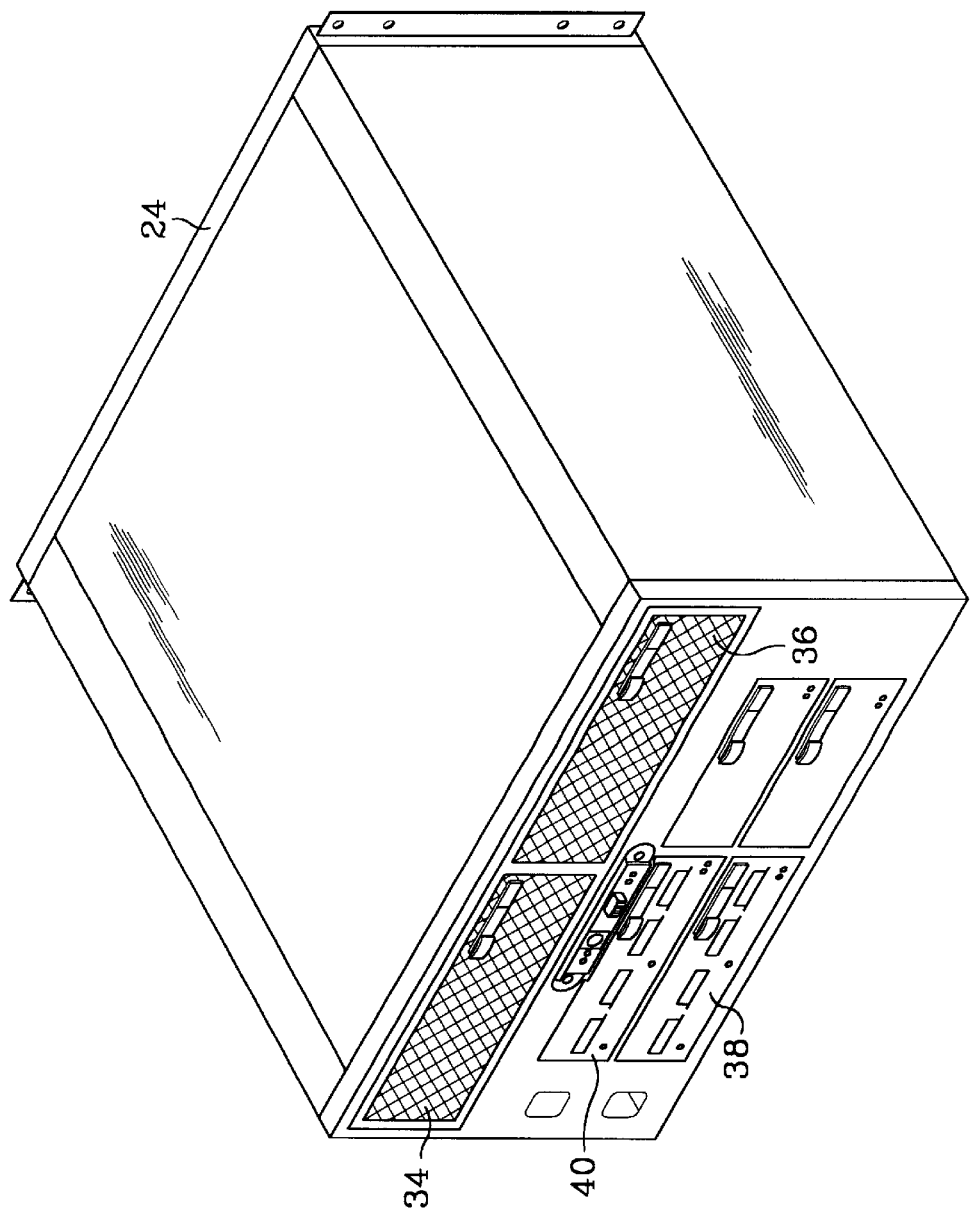
FIG. 5 is a perspective view of the rear of the housing of FIG. 4

FIGS. 4 and 5 illustrate one example of a data storage system 18 with which the invention can be used. Referring to FIGS. 4 and 5, data storage system 18 includes a group of individual device modules 20 and 22, such as the disk drive modules used in a RAID data storage systems, housed in a housing 24. FIG. 4 shows the front of housing 24. FIG. 5 shows the rear of housing 24. The electronic device in each module 20 and 22 is housed in an enclosure like the one illustrated in FIG. 3 in which the front panel and rear portions are constructed as an EMI shield. System 18 may also include, for example, power supplies 26 and 28, battery back-up units 30 and 32, cooling fan modules 34 and 36 and input/output modules 38 and 40. Power supplies 26 and 28 provide the necessary electrical power for system 18. Battery back-up units 30 and 32 provide an alternative power source in the event of a failure of one or more of the power supplies 26 and 28. Fan modules 34 and 36 circulate air through housing 24 to cool the components. The input/output modules 38 and 40 enable the system components to communicate with external devices. The front panels and other parts of the enclosures for power supplies 26 and 28 and battery back-ups 30 and 32 might also be constructed as EMI shields using the structures of the present invention.

Figure 6:
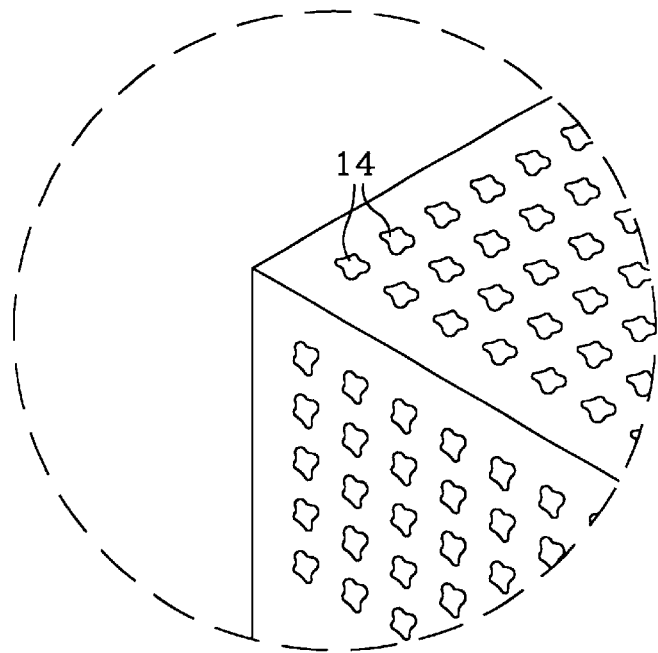
FIG. 6 is a close-up perspective view of the rear corner of the device module of FIG. 3 showing EMI shielding using waveguides constructed according to one embodiment of the present invention.
Figure 7:
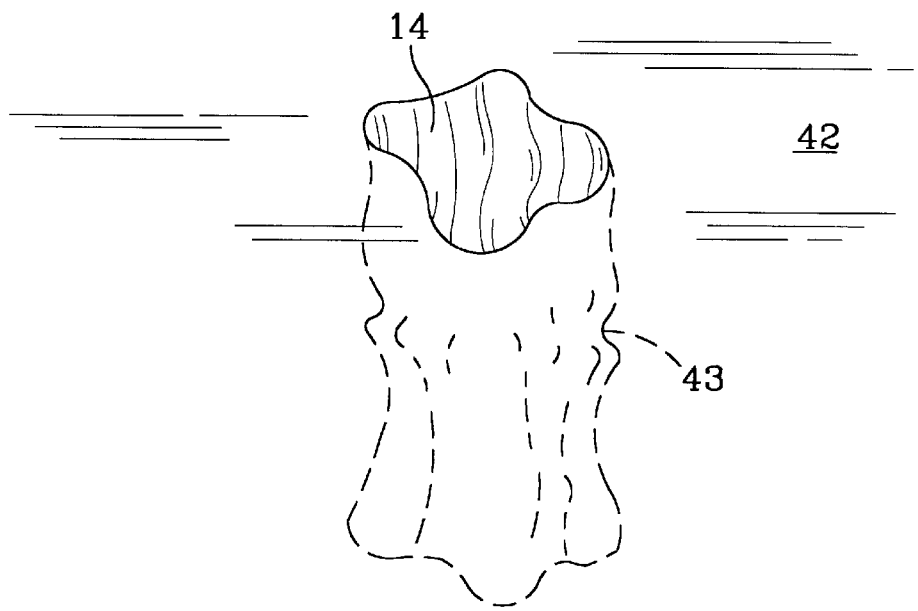
FIG. 7 is a detailed perspective view showing one of the waveguides of FIG. 6.
Figure 8:
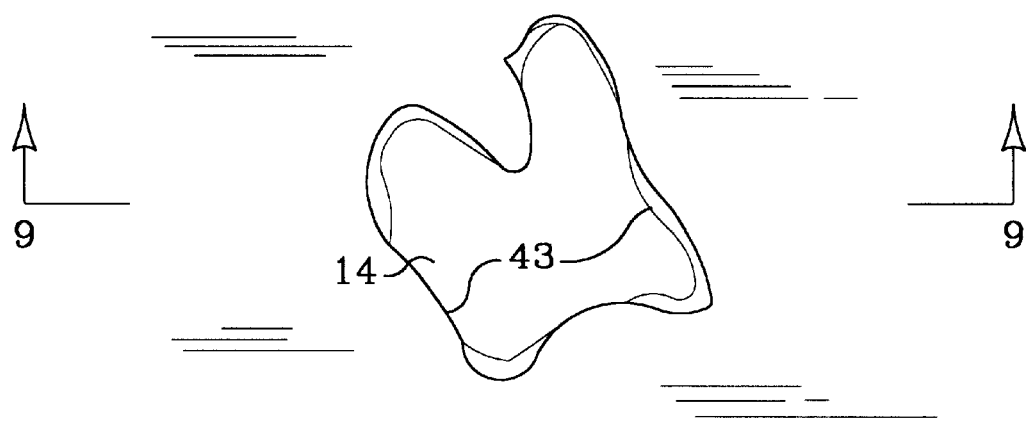
FIG. 8 is a plan view of the waveguide of FIG. 7.
Figure 9:
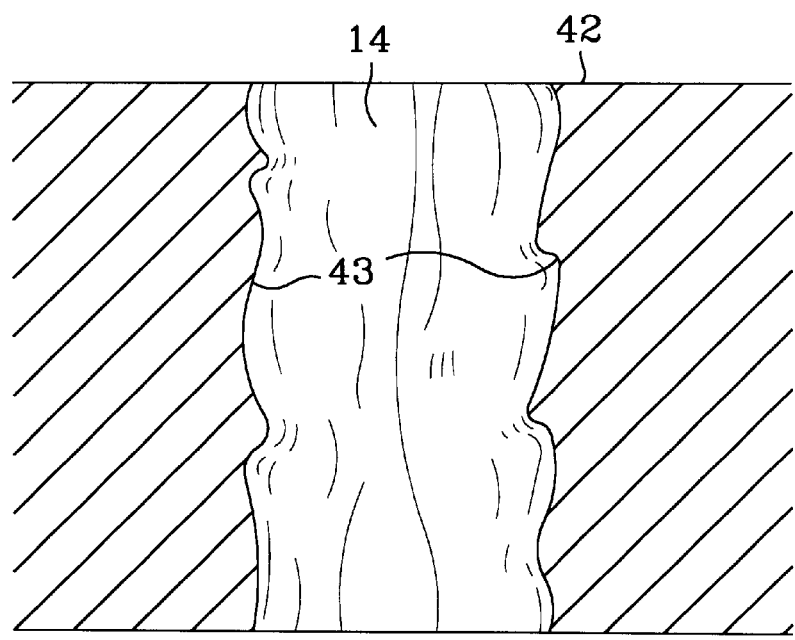
FIG. 9 is a section view taken along the line 9—9 in FIG. 8.

The details of one embodiment of the waveguide structure of the present invention will now be described with reference to FIGS. 6–9. FIG. 6 is a close-up perspective view of the rear corner of the device module enclosure 10 of FIG. 3. FIGS. 6–9 show one embodiment of an EMI shield in which the waveguide structure that defines openings 14 are used to attenuate electromagnetic radiation while allowing air flow through the shield. FIG. 7 is a detailed perspective view of one opening 14. FIG. 8 is a plan view of the opening of FIG. 7. FIG. 9 is a cross section view of the opening taken along the line 9—9 in FIG. 8.

Referring to FIGS. 6–9, a multiplicity of openings 14 are formed in metal or other conductive material 42. Unlike conventional waveguides in which the opening is substantially uniform along its length, the waveguide of the present invention includes an opening defined by non-uniform three dimensional sidewalls 43. The particular geometry of this three dimensional, preferably non-uniform, opening 14 may be selected as necessary or desirable to help optimize performance for any particular application. For example, undulations or cavities in sidewalls 43 perpendicular to the flow of air through opening 14 can be used to increase the size of opening 14 to permit greater air flow while still maintaining the desired level of EMI attenuation. The three dimensional geometry of opening 14 could be selected to create interference among the electromagnetic waves passing through the waveguide to improve attenuation without impeding air flow.

Figure 9A:
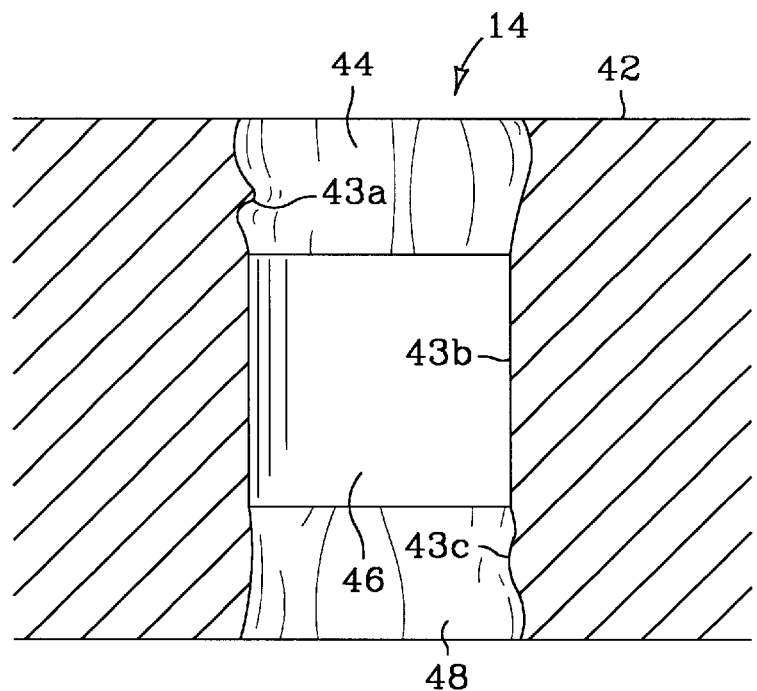
FIGS. 9A and 9B are section views illustrating alternative embodiments of a waveguide opening in which the entry, center and exit portions of the opening have comparable cross sectional areas but substantially different geometries.
Figure 9B:
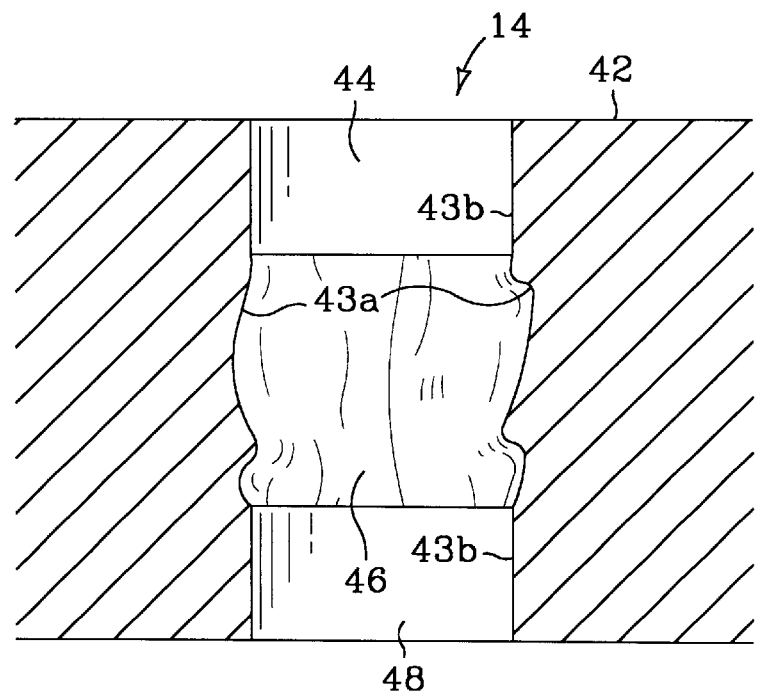

The section views of FIGS. 9A and 9B show alternative embodiments in which the geometry of opening 14 varies between a non-uniform three dimensional shape and a uniform shape. In FIG. 9A, entry and exit portions 44 and 48 of opening 14 is defined by non-uniform three dimensional sidewalls 43a and 43c while a center portion 46 is defined by uniform two dimensional sidewalls 43b. In FIG. 9B, the entry and exit portions 44 and 48 are defined by uniform two dimensional sidewalls 43b while the center portion 46 is defined by non-uniform three dimensional sidewalls 43a. FIGS. 9A and 9B illustrate two examples of a waveguide opening 14 in which the entry 44, center 46 and exit 48 portions of the opening have comparable cross sectional areas but substantially different geometries.

While conductive material 42 may be any conductive material suitable for EMI shielding, it is expected that plastic or some other type of moldable or castable material will be used to more easily manufacture the desired shapes. Non-conductive plastic or other moldable material plated with conductive material could also be used.

Figure 10:
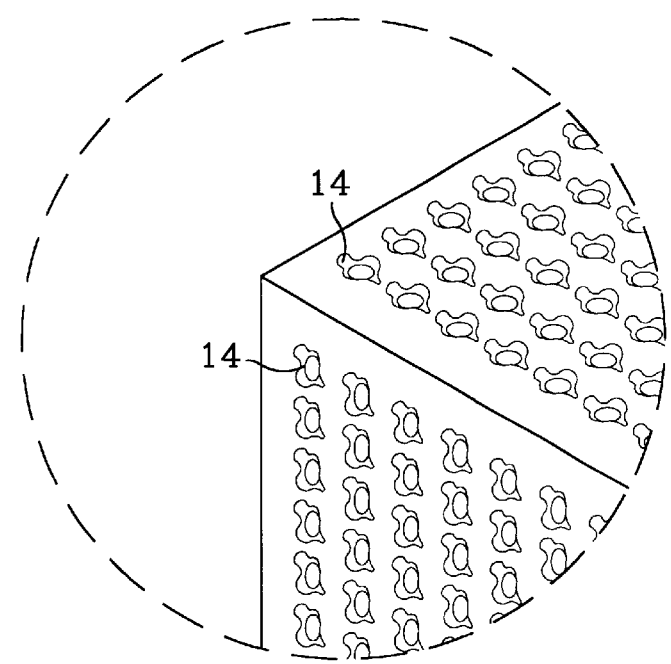
FIG. 10 is a close-up perspective view of the rear corner of the device module of FIG. 3 showing EMI shielding using waveguides constructed according to one embodiment of the present invention in which the entry portion of the opening is substantially larger than a center conduit portion of the opening.
Figure 11:
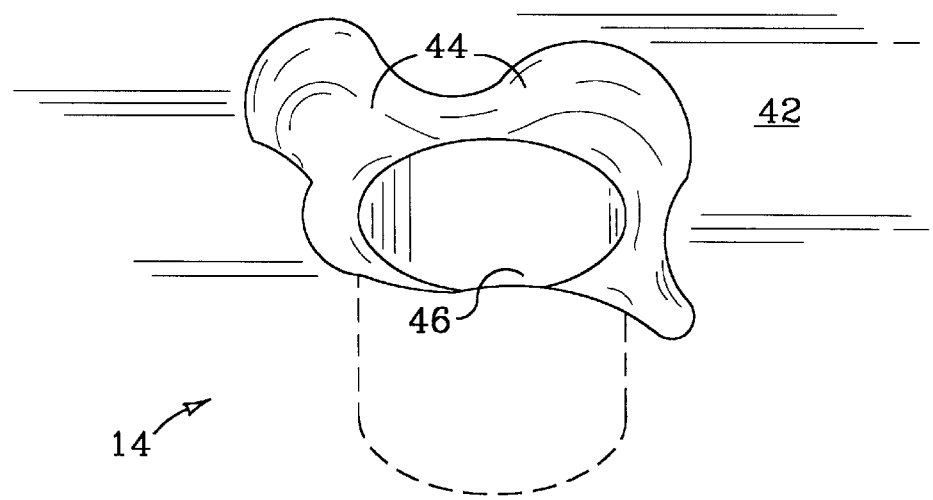
FIG. 11 is a detailed perspective view showing one of the waveguides of FIG. 10.
Figure 12:
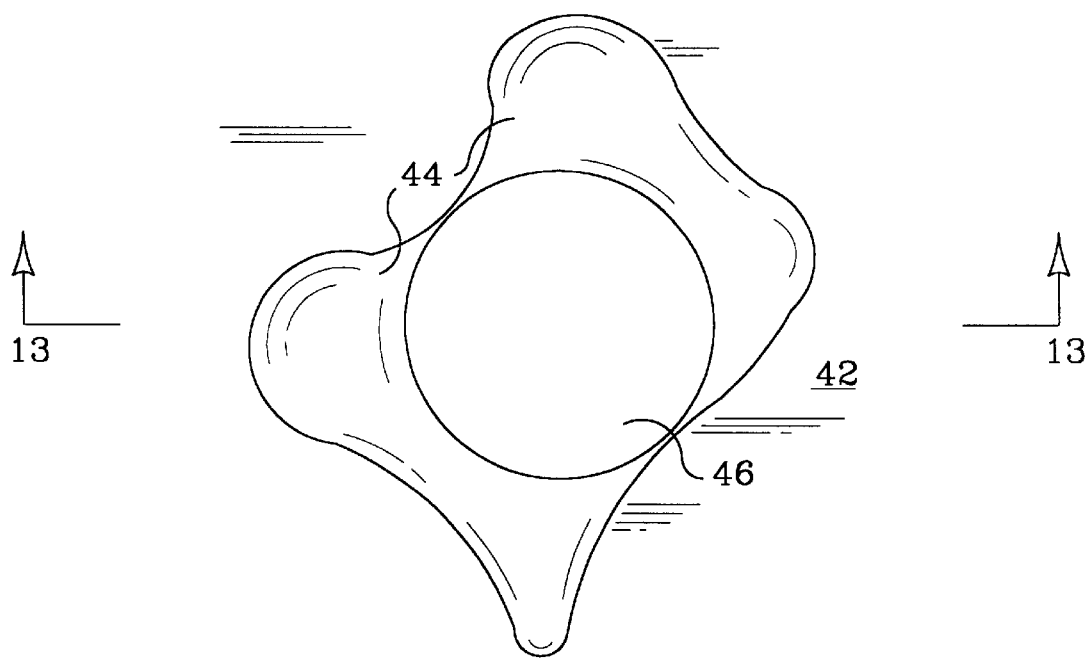
FIG. 12 is a plan view of the waveguide of FIG. 11.
Figure 13:
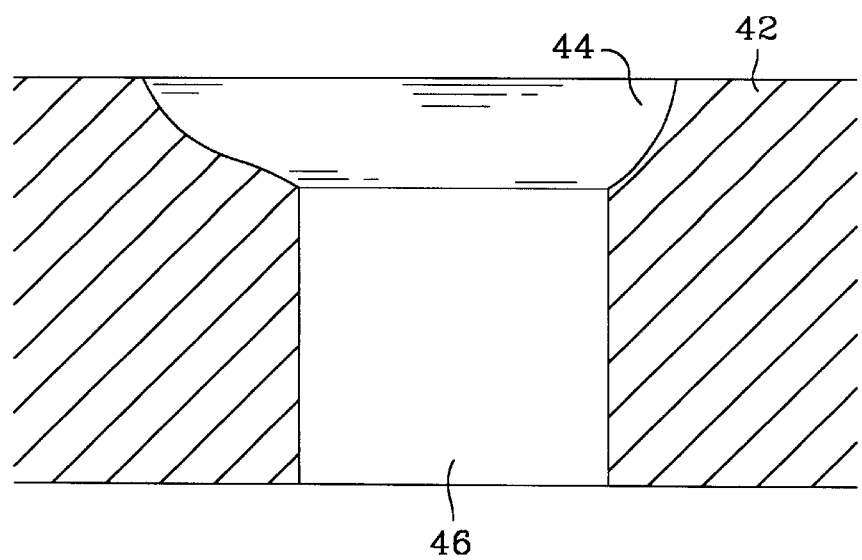
FIG. 13 is a section view taken along the line 13—13 in FIG. 12.

Another embodiment of the waveguide structure of the present invention is shown in FIGS. 10–13. FIG. 10 is a close-up perspective view of the rear corner of the device module enclosure 10 of FIG. 3. FIG. 11 is a detailed perspective view of one opening 14. FIG. 12 is a plan view of the opening of FIG. 11. FIG. 13 is a section view of the opening taken along the line 13—13 in FIG. 12.

Referring to FIGS. 10–13, a multiplicity of openings 14 are formed in metal or other conductive material 42. Each opening 14 is characterized by an entry area 44 and an elongated conduit portion 46. Entry 44 is, at the surface of conductive material 42, larger in cross sectional area than conduit portion 46 and, therefore, the larger entry 44 transitions down to the smaller conduit portion 46. Opening up the waveguide at the receiving point with entry 44 creates an antenna structure that receives electromagnetic radiation emanating from inside the enclosure. Hence, the shape of entry 44 should be selected to minimize the antenna effect while still achieving the desired air flow.

Figure 14:
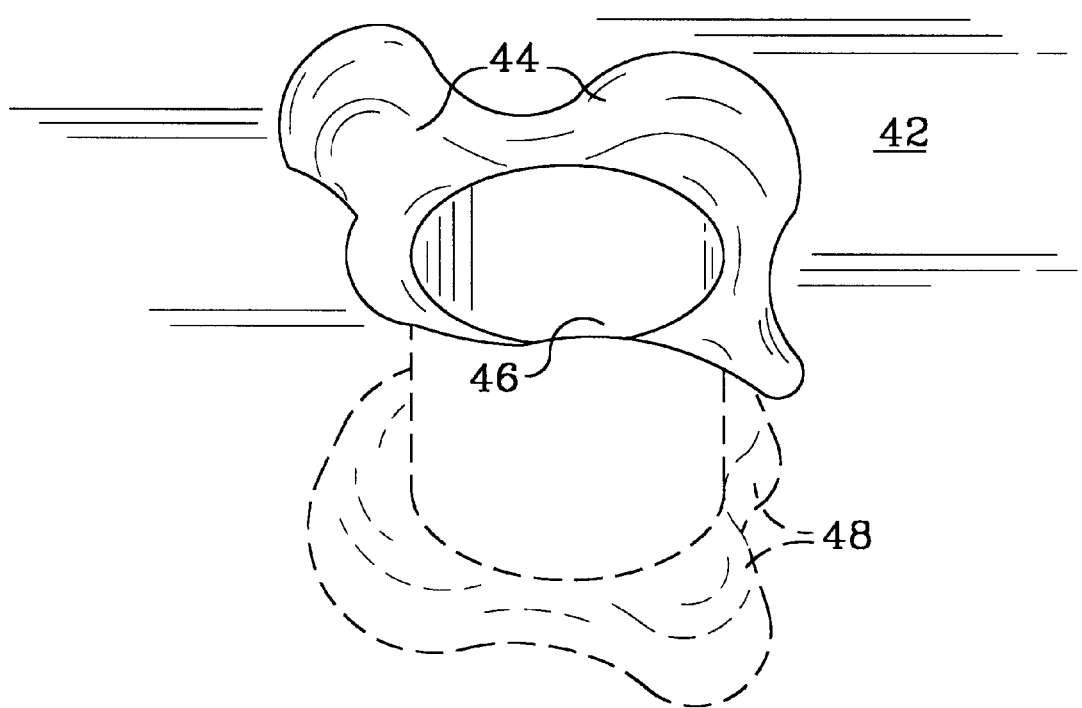
FIG. 14 is a detailed perspective view of another embodiment of the waveguides of the present invention in which the entry and exit are substantially larger than the center conduit portion of the opening.
Figure 15:
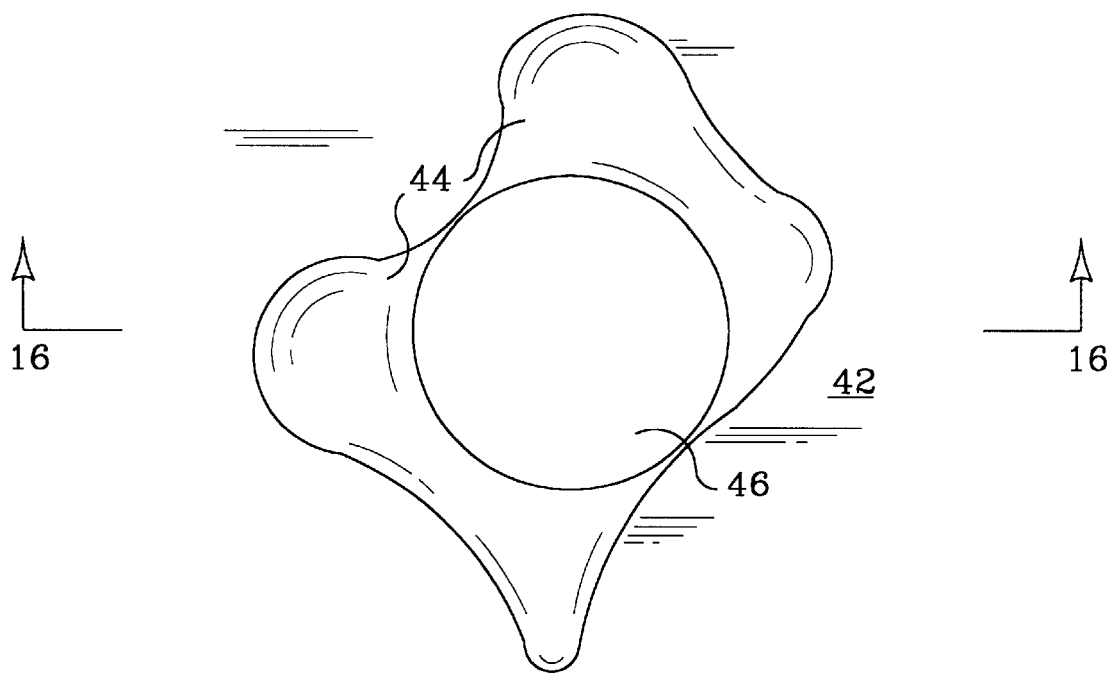
FIG. 15 is a plan view of the waveguide of FIG. 14.
Figure 16:
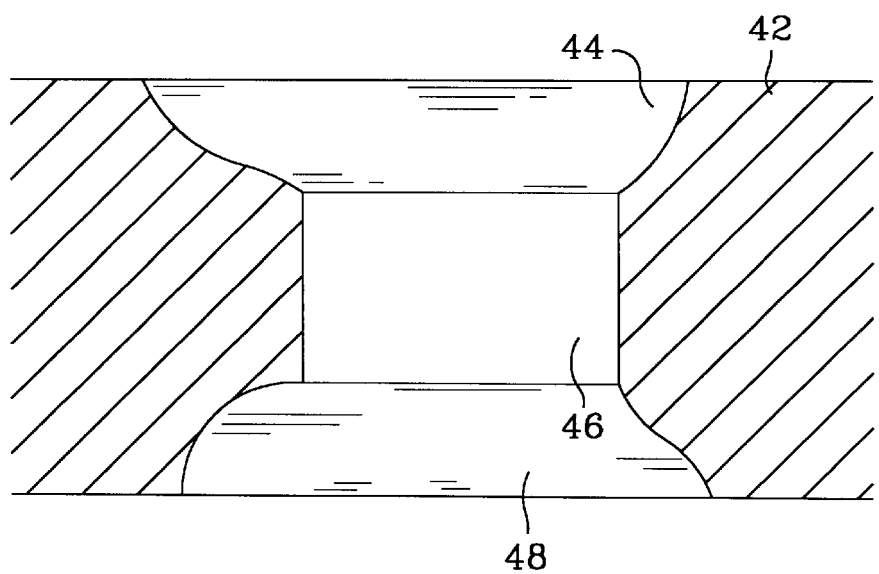
FIG. 16 is a section view taken along the line 16—16 in FIG. 15.

In another embodiment of openings 14 shown in FIGS. 14–16, conduit portion 46 extends between entry 44 and a substantially enlarged exit area 48. Exit 48 acts as a transmitting antenna for any electromagnetic radiation that survives conduit portion 46. Therefore, like entry 44, exit 48 should be sized and shaped to minimize this antenna effect.

The particular geometry of entry 44, conduit 46 and exit 48 may be selected as necessary or desirable to help optimize performance for any particular application and need not be limited to the circles, rectangles or hexagons typical of conventional waveguides. For entry 44 and exit 48, non-uniform shapes, particularly three dimensionally non-uniform shapes, are expected to have the weakest antenna effect and, therefore, are the presently preferred shapes. Conduit portion 46 functions like a conventional waveguide accepting and attenuating electromagnetic radiation received through entry 44. The enlarged entry 44 and exit 48 effectively increases the size of openings 14, permitting greater air flow while still achieving the electromagnetic radiation attenuation associated with the smaller diameter conduit portion 46.

The present invention has been shown and described with reference to the foregoing exemplary embodiments. Other embodiments are possible. It should be understood, therefore, that the invention is to be construed broadly within the scope of the following claims.

What is claimed is:

1. An electromagnetic interference shield, comprising conductive material having a plurality of openings therein, each opening including an entry and an elongated conduit connected to and extending away from the entry, the entry having a shape non-uniform in three dimensions and tapering from an exterior opening down to the conduit.

2. An electromagnetic interference shielded electronic module, comprising:

an electronic device capable of generating electromagnetic radiation; and a housing at least partially enclosing the electronic device, the housing having a plurality of walls at least one of which comprises a conductive material having a plurality of openings therein, each opening including an entry and an elongated conduit connected to and extending away from the entry area, the entry having a shape non-uniform in three dimensions and tapering from an exterior opening down to the conduit.

* * * * *